United States Patent
Merenda et al.

(10) Patent No.: US 7,026,869 B2
(45) Date of Patent: Apr. 11, 2006

(54) BROADBAND AMPLIFIER HAVING OFFSET MICROSTRIP SECTION IN A HOUSING MODULE

(75) Inventors: Joseph L. Merenda, Massapequa, NY (US); Michael Zaffarano, Bellport, NY (US); Eric Darvin, East Northport, NY (US)

(73) Assignee: L-3 Communications, Hauppauge, NY (US)

( * ) Notice: Subject to any disclaimer, the term of this patent is extended or adjusted under 35 U.S.C. 154(b) by 74 days.

(21) Appl. No.: 10/338,325

(22) Filed: Jan. 8, 2003

(65) Prior Publication Data

US 2004/0130417 A1    Jul. 8, 2004

(51) Int. Cl.
*H03F 3/195*    (2006.01)
(52) U.S. Cl. .................. 330/66; 333/247; 257/728
(58) Field of Classification Search ........... 333/247; 330/66, 68; 257/664, 728, 684, 695, 724, 257/725
See application file for complete search history.

(56) References Cited

U.S. PATENT DOCUMENTS 5,012,213 A * 4/1991 Tsai ........................... 333/247
6,700,457 B1 * 3/2004 McCall et al. ................ 333/33

* cited by examiner

*Primary Examiner*—Benny Lee
(74) *Attorney, Agent, or Firm*—Baker Botts L.L.P.

(57) ABSTRACT

A broadband driver amplifier module is made using an arrangement of MMICS and microstrip to provide inline rf connectors for the input and output and a small package size. The input and output microstrips incorporate a microstrip portion which is at an angle to the axis of the input connector providing an offset from the axis of the input connector. There is provided at least one MMIC extending from the input microstrip at the offset across the input connector axis and having an output on the other side of the axis. This arrangement provides for an overall zigzag configuration which reduces the axial length of the package while maintaining inline input and output connectors. The invention further includes novel arrangements for MMIC mounting and d.c. blocks used in the amplifier.

11 Claims, 3 Drawing Sheets

BROADBAND AMPLIFIER HAVING OFFSET MICROSTRIP SECTION IN A HOUSING MODULE

BACKGROUND OF THE INVENTION

The present invention relates to broadband amplifiers and in particular to an MMIC based amplifier module for driving optical modulators or similar applications. It is an object of the present invention to provide a new and improved amplifier module, which utilizes monolithic microwave integrated circuit (MMIC) amplifiers and which has ultra wide-band performance capability.

SUMMARY OF THE INVENTION

In accordance with the invention there is provided a wide-band driver amplifier module, which includes a housing having a cavity. A coaxial RF input is provided, arranged on a first wall of the housing and having a first axis. An RF coaxial output is arranged on a second wall of the housing opposite to the first wall. A first microstrip section is arranged in the cavity and includes a first d.c. block. The first microstrip section includes a first portion connected to the RF input and extending in a first direction substantially parallel to the first axis and a second portion extending at an acute angle to the first direction forming a first offset from the axis. A second microstrip section is arranged in the cavity and includes a bias-tee, which is comprised of a d.c. block and a choke coil. The second microstrip section includes a third portion connected to the RF output and extending in a third direction substantially parallel to the first axis and a fourth portion extending in a fourth direction having an acute angle to the third direction forming a second offset from the axis opposite to the first offset. At least a first MMIC is arranged in the cavity and extends in a direction substantially perpendicular to the second direction across the axis from the first offset. The MMIC is connected at a first end to the second portion of the first microstrip and has a second end electrically connected to the fourth portion of the second microstrip.

In a preferred arrangement the cavity closely surrounds the first microstrip, the second microstrip and the MMIC. The cavity preferably has a cross section which is sized to prevent propagation of parasitic higher order waveguide modes up to a frequency higher than the maximum operating frequency for the amplifier. The driver can further include a second MMIC having a first end and a second end connected to the fourth portion of the second microstrip, and the second MMIC extending in a direction substantially perpendicular to the fourth direction across the axis from the second offset and wherein the second end of the first MMIC is electrically connected to the fourth portion of the second microstrip by the second MMIC and at least one intermediate microstrip arranged in electrical circuit between the second end of the first MMIC and the first end of the second MMIC. The intermediate microstrip may include an additional bias tee. The wide-band amplifier may also include a third MMIC electrically connected between the first and second MMICs or after the second MMIC. The amplifier may further include a driver circuit mounted to the housing and including leads connecting to at least one microstrip at a portion between the first and second d.c. blocks. The leads may include r.f. chokes. The housing may include a cover arranged to hermetically seal the cavity.

In one arrangement of the wide-band driver amplifier module, the housing includes a mounting cavity having a selected depth and a selected horizontal cross section viewed in the plane of the microstrip. The MMIC is mounted on an upper surface of a carrier arranged in the cavity. The carrier is formed of conductive material selected to have thermal expansion properties corresponding to thermal expansion properties of the MMIC. The carrier has a height corresponding to the mounting cavity depth and a cross section less than the cross section of the mounting cavity so that a gap exists between the horizontal periphery of the carrier and the mounting cavity. Microstrip transmission lines connected to the ends of the MMIC extend over the gap to the upper surface of the carrier. The ends of the microstrip transmission line lie on the upper surface adjacent to the MMIC and jumpers interconnect conductors of the microstrip transmission lines to the first and second ends of the MMIC.

The amplifier may include d.c. blocks which comprise a gap in a conductor of the microstrip transmission line, a first beam lead capacitor connected to the conductor across the gap and a second multi-layer chip capacitor connected across the gap in parallel with the first beam lead capacitor.

In accordance with the invention there is provided an MMIC assembly comprising a conductive housing having a planar surface and a mounting cavity having a selected depth and a selected horizontal cross section formed therein. A MMIC is mounted on an upper surface of a carrier, which is arranged in the cavity. The carrier is formed of a conductive material selected to have thermal expansion properties corresponding to thermal expansion properties of the MMIC. The carrier has a height corresponding to the mounting cavity depth and a cross section less than the cross section of the mounting cavity so that a gap exists between the horizontal periphery of the carrier and the mounting cavity. First and second microstrip transmission lines each having a strip conductor and a ground plane separated by insulating material are provided. The microstrip transmission lines are mounted to the planar surface of the housing and extend over the gaps to the upper surface of the carrier. Each microstrip transmission line has an end lying on the upper surface adjacent to the MMIC and jumpers interconnect the conductors of the microstrip transmission lines to respective ends of the MMIC.

In accordance with the present invention there is provided a broadband microstrip d.c. block which includes a microstrip having a conductor mounted on a dielectric substrate and separated from a ground plane. A gap is provided in the conductor. A first beam lead capacitor is connected to the microstrip across the gap and a second multi-layer chip capacitor is connected across the gap in parallel to the first beam lead capacitor.

For a better understanding of the present invention, together with other and further objects, reference is made to the following description, taken in conjunction with the accompanying drawings, and its scope will be pointed out in the appended claims.

DESCRIPTION OF A PREFERRED EMBODIMENT

Figure 1:
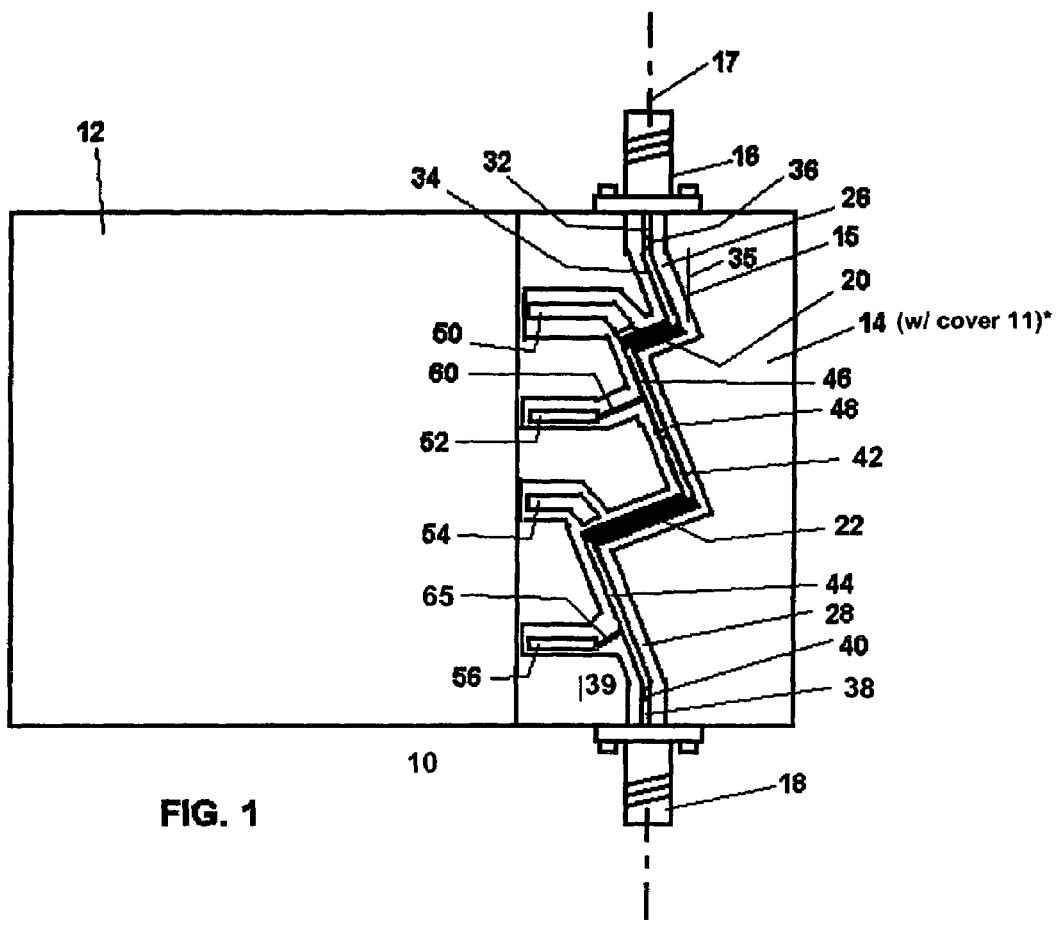
FIG. 1 is a top view, cover removed of a broadband amplifier module in accordance with the present invention.

Referring to FIG. 1 there is shown a top view of a broadband driver amplifier module according to a preferred embodiment of the present invention. The amplifier 10 shown in FIG. 1 includes a housing 14 which has an elongated cavity 15 formed in a top surface to accommodate a microwave circuit. At opposite ends of housing 14 there are provided inline connectors 16, 18 for mating with coaxial cables. Connector 16 has an axis 17. Connector 18 in the arrangement shown in FIG. 1 has an axis coincident with axis 17 of connector 16. Mounted on housing 14 is a circuit enclosure 12 for providing power supply and bias circuits for operation of the amplifier 10. The inner conductor of connector 16 is connected to the conductor of a first microstrip section 26 which includes a first portion 32 extending substantially along the axis 17 and a second section 34 extending in a direction which forms an acute angle with axis 17. A d.c. block 36 is provided in the first microstrip section 26. First and second MMICs 20 and 22 are provided as amplifying elements. An intermediate microstrip section 42 interconnects the output of first MMIC 20 and the input of second MMIC 22. A second microstrip section 28 connects the output of second MMIC 22 and connector 18. Microstrip section 28 includes a third portion 38 which extends parallel to axis 17 and a fourth portion 44 which forms an acute angle with the direction of microstrip portion 38. The angle of microstrip portion 34 causes a first offset 35 with respect to axis 17. Likewise the angle of microstrip section 44, which may be substantially parallel to microstrip section 34 forms a second opposite offset 39 with respect to axis 17.

MMIC 20 has its input end connected to microstrip portion 34 and extends substantially perpendicular thereto crossing axis 17. Likewise the output of MMIC 22 is offset from axis 17 by offset 39 formed by microstrip portion 44. Intermediate microstrip section 46 extends between the output of MMIC 20 and the input of MMIC 22. Microstrip section 46 includes an additional d.c. block 48.

The arrangement of the broadband amplifier 10 shown in FIG. 1 provides the advantage of a low package size and shortened length, while at the same time providing a simplified design which avoids parasitic high-frequency higher waveguide mode resonances and provides inline input and output connectors, which are advantageous in many circuit applications. Conductors 50, 52, 54 and 56 interconnect the amplifiers 10 with the power supply and driving circuit 12. Inputs 50 and 54 provide bias voltages for MMICs 20 and 22, respectively. Conductors 52 and 54 provide d.c. power which is applied to microstrip 42 and microstrip portion 44 to power MMICs 20 and 22, respectively. Miniature choke coils 60, 65 are arranged between terminals 52, 56 and their respective microstrips, and provide a d.c. path while blocking r.f. signals from terminals 52, 54.

Figure 1A:
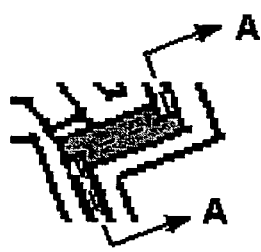
FIG. 1A is an enlarged portion of the FIG. 1 top view.
Figure 2:
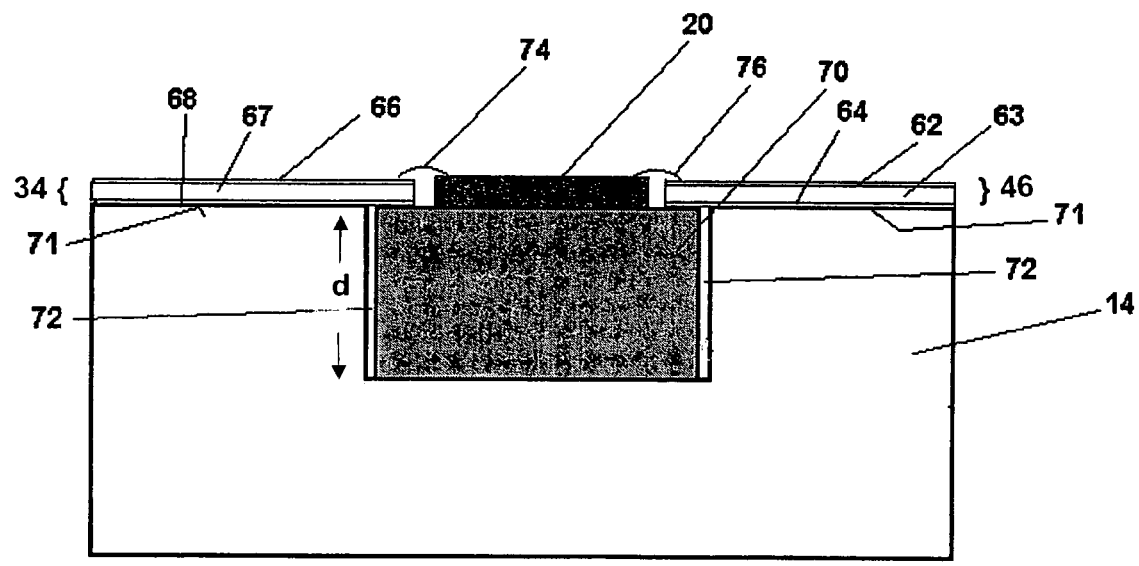
FIG. 2 is a cross sectional view of a portion of the broadband amplifier of FIG. 1 showing the microstrip MMIC interface.

Referring to FIG. 2 there is shown a cross sectional view of MMIC 20 and its surrounding structure along a section line AA shown in the enlarged view of FIG. 1A. Input microstrip portion 34 includes a conductor 66 and a ground plane 68 which are separated by dielectric 67. Likewise intermediate microstrip 46 includes a conductor 62 and a groundplane 64 separated by dielectric 63. The housing 14 includes a mounting cavity 72 formed below the plane 71 on which microstrips 34 and 46 are mounted. Mounting cavity 72 has a selected depth "d" and a selected cross-section in the plane of the microstrip, such as a rectangular cross-section. A carrier 70 is received in mounting cavity 72 and is formed of a conductive material such as Molybdenun-Copper and Tungsten-Copper having very high thermal conductivities and thermal expansion properties similar to the thermal expansion properties of MMIC 20. Accordingly, changes in temperature will not affect the bonding between MMIC 20 and carrier 70. The carrier 70 has a cross-section which is smaller than the cross-section of mounting cavity 72 so that carrier 70 can expand and contract within mounting cavity 72 without mechanical forces acting to otherwise destroy the structure. Carrier 70 is bonded with conductive adhesive to housing 14 and MMIC 20. Input microstrip portion 34 extends from the planar mounting surface 71 of housing 14 over the gap onto the upper surface of carrier 70 and output microstrip 46 extends over the gap between the upper surface of housing 14 and the upper surface of carrier 70. Jumper wires 74, 76 interconnect the RF circuit of MMIC 20 and the conductors 66, 62 of microstrips 34, 46 respectively.

Figure 3:
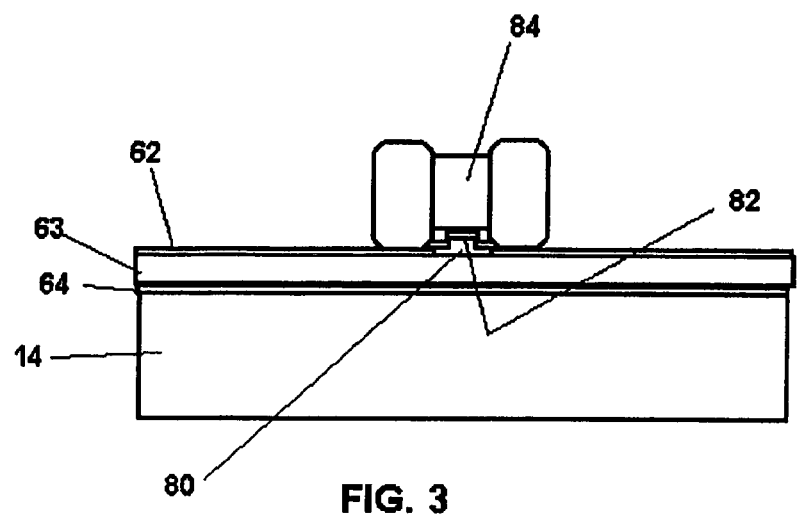
FIG. 3 is a side view of a d.c. block useful in the amplifier of FIG. 1.

Referring to FIG. 3 there is shown an arrangement for an improved d.c. block operating over a wide-frequency band. The d.c. block illustrated in FIG. 3 may be used for example as d.c. blocks 36, 48 and 40 in the amplifier 10 of FIG. 1. The inventors have discovered that a broadband d.c. block can be constructed by using two different capacitor types, the capacitor's being arranged in parallel across a gap in the microstrip to achieve a wide-band performance. For example, the amplifier 10 shown in FIG. 1 is intended to have an operating frequency which may extend from approximately 30 kHz to over 50 GHz. It is recognized that at frequencies below about 2 GHz conventionally used beam lead capacitors no longer effectively function to bridge a gap in a microstrip circuit to form a d.c. block. It is likewise recognized that at high frequencies, multi-layer capacitors do not function effectively because they have an impedance representing a high series resistance at high frequencies. The d.c. block arrangement shown in FIG. 3 includes a microstrip 44 (see FIG. 1) which includes a conductor 62 separated from a ground plane 64 by a dielectric 63. A gap 80 is formed in conductor 62 to provide a d.c. block. A beam lead capacitor 82 bridges the gap 80 in conductor 62 and forms an effective electrical path at frequencies of 2 GHz and above. A second capacitor comprising a multi-layer chip capacitor 84 is arranged in parallel with capacitor 82 to bridge gap 80. Capacitor 84 provides an effective circuit path for frequencies below about 2 GHz. The combined effect of capacitors 82 and 84 is to provide an effective d.c. path over a frequency range of about 30 KHz to about 45 to 50 GHz. Capacitor 82 may, for example, be a beam lead capacitor of about 20 pf available from Metellics. Capacitor 84 may, for example, be a 0.1 to 0.33 µF multi-layer capacitor available from AVX.

It will be recognized that the circuit elements forming the amplifier 10 on FIG. 1 are arranged in a cavity in an upper surface of housing 14. The cavity dimensions are preferably selected to avoid parasitic higher order waveguide mode microwave propagation within the frequency range of interest. Accordingly, the cavity dimensions, particularly the width thereof are selected to be low enough to avoid such higher modes. Housing 14 of the FIG. 1 amplifier is arranged to have a cover 11 mounted over the circuit thereof and may thereby be hermetically sealed to protect the sensitive microwave components, particularly MMICS 20 and 22.

Figure 4:
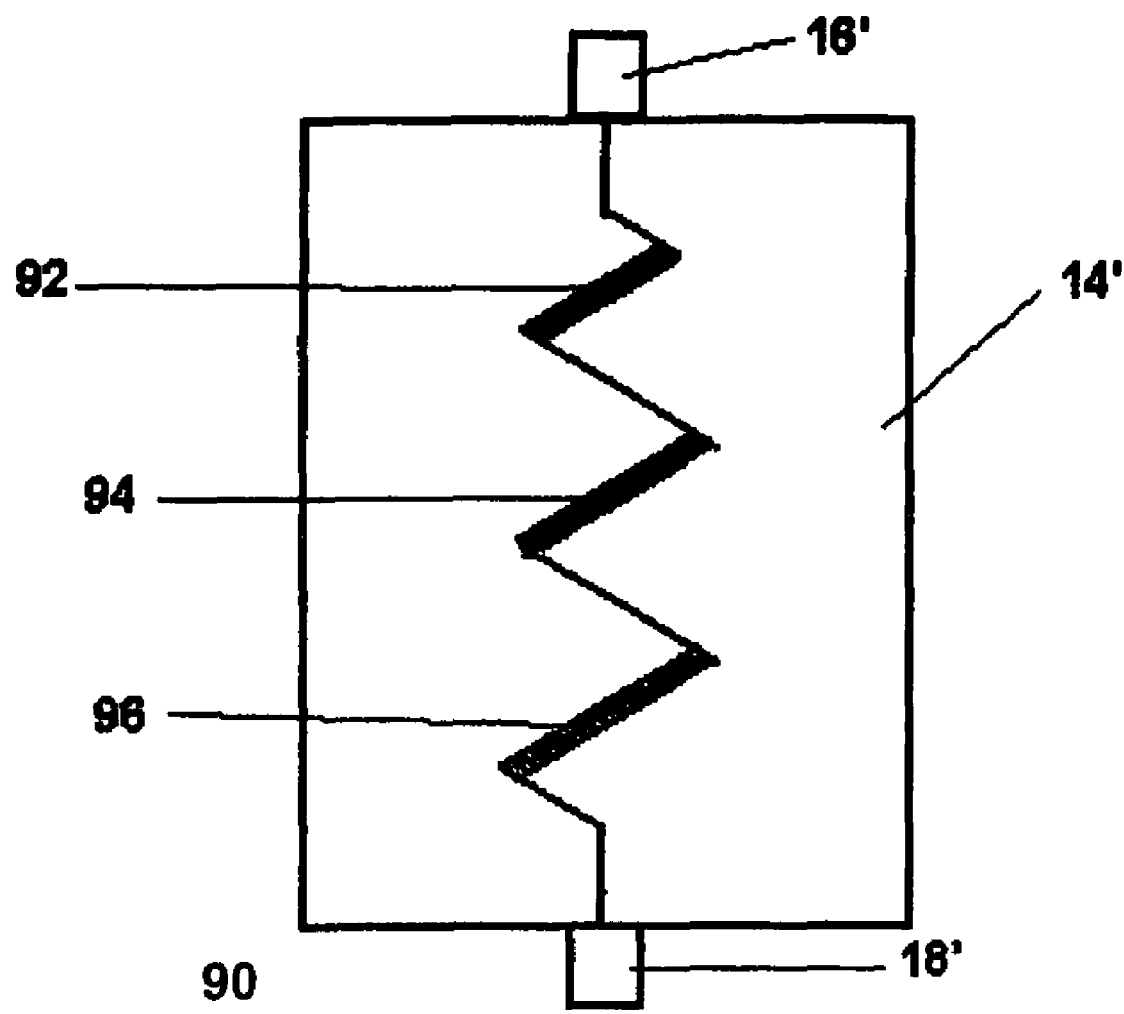
FIG. 4 is a simplified diagram showing an alternate embodiment of the invention.

Those skilled in the art will recognize that amplifiers can be made having 1, 2 or 3 stages following the arrangements of the present invention. A simplified drawing showing an arrangement of an amplifier 90 in housing 14' having 3 MMICS 92, 94, 96 is show in FIG. 4. At opposite ends of housing 14' there are provided inline connectors 16' and 18' for mating with coaxial cables.

While they have been described what are believed to be the preferred embodiments of the present invention, those skilled in the art will recognize that other and further changes and modifications may be made thereto without departing from the spirit of the invention, and it is intended to claim all such changes and modifications as fall within the true scope of the invention.

The invention claimed is:

1. A wide-band driver amplifier module, comprising:
 a housing having a cavity;
 a coaxial r.f. input, having a first axis, arranged on a first wall of said housing;
 a coaxial r.f. output arranged on a second wall of said housing opposite said first wall;
 a first microstrip section arranged in said cavity and including a first d.c. block, said first microstrip section including a first portion, connected to said r.f. input and extending in a first direction substantially parallel to said first axis, and a second portion extending at an acute angle to said first direction, thereby defining a first offset from said first axis;
 a second microstrip section arranged in said cavity and including a second d.c. block and choke coil, said second microstrip section including a third portion, connected to said r.f. output and extending in a third direction substantially parallel to said first axis, and a fourth portion extending in a fourth direction having an acute angle to said third direction, thereby defining a second offset from said first axis opposite said first offset; and
 at least a first MMIC arranged in said cavity and extending in a direction substantially perpendicular to a second direction across said first axis from said first offset, said at least a first MMIC being connected at a first end to said second portion of said first microstrip and having a second end electrically connected to said fourth portion of said second microstrip.

2. A wide-band driver amplifier as specified in claim 1 wherein said cavity closely surrounds said first microstrip, said second microstrip and said at least a first MMIC.

3. A wide-band driver amplifier as specified in claim 2 for operations up to a maximum selected frequency, wherein said cavity has a cross section of a size which prevents propagation of higher order modes up to a frequency higher than said maximum selected frequency.

4. A wide-band driver amplifier as specified in claim 1 further including a second MMIC, having a first end and a second end, connected to said fourth portion of said second microstrip and extending in a direction substantially perpendicular to said fourth direction across said first axis from said second offset, and wherein said second end of said at least a first MMIC is electrically connected to said fourth portion of said second microstrip by said second MMIC and at least one intermediate microstrip arranged in electrical circuit between said second end of said at least a first MMIC and said first end of said second MMIC.

5. A wide-band driver amplifier as specified in claim 4 wherein said at least one intermediate microstrip includes an associated d.c. block.

6. A wide-band driver amplifier as specified in claim 4 further including a third MMIC electrically connected between said at least a first MMIC and said second MMIC.

7. A wide-band driver amplifier circuit as specified in claim 1 further including MMIC driver circuits mounted to said housing and including leads connecting to at least one of said first and second microstrip sections at a position between said first and second d.c. blocks.

8. A wide-band driver circuit as specified in claim 7 wherein said leads include r.f. chokes.

9. A wide-band driver amplifier as specified in claim 1 wherein said housing includes a cover arranged to hermetically seal said cavity.

10. A wide-band driver amplifier as specified in claim 1 wherein said housing includes said cavity having a selected depth and a selected horizontal cross sections viewed in the plane of said first and second microstrip section, wherein at least said first MMIC is mounted on an upper surface of a carrier arranged in said cavity, said carrier comprised of conductive material selected to have thermal expansion properties corresponding to thermal expansion properties of at least said first MMIC, said carrier having a height corresponding to said cavity depth and cross section less than said cross section of said cavity, whereby a gap exists between the horizontal periphery of said carrier and said cavity, wherein microstrip transmission lines connected to ends of at least said first MMIC extend over said gap to said upper surface of said carrier, ends of said microstrip transmission lines lying on said upper surface adjacent to at least said first MMIC, and wherein said microstrip transmission lines interconnect a conductor of said first and second microstrip sections to said first and second ends of at least said first MMIC.

11. A wide-band driver amplifier as specified in claim 1 wherein said first and second d.c. blocks comprise a gap in a conductor of said first and second microstrip sections, a first beam lead capacitor connected to said conductor of said first and second microstrip sections across said gap and a second multilayer chip capacitor connected across said gap in parallel with said first beam lead capacitor.

* * * * *